United States Patent
Pang et al.

(10) Patent No.: US 8,570,743 B2
(45) Date of Patent: Oct. 29, 2013

(54) MOUNTING APPARATUS FOR FANS

(75) Inventors: Wei Pang, Shenzhen (CN); Jun-Hui Wang, Shenzhen (CN); Kun Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/495,014

(22) Filed: Jun. 13, 2012

(65) Prior Publication Data

US 2013/0234000 A1 Sep. 12, 2013

(30) Foreign Application Priority Data

Mar. 8, 2012 (CN) .............................. 2012 1 059370

(51) Int. Cl.
- *H05K 7/20* (2006.01)
- *H05K 5/00* (2006.01)
- *G06F 1/20* (2006.01)
- *A47B 96/06* (2006.01)

(52) U.S. Cl.
USPC ............... 361/695; 361/679.48; 248/220.21

(58) Field of Classification Search
USPC ............... 248/27.1, 200.1, 225.11, 225.21, 248/220.21, 221.11; 312/223.1, 223.2, 236; 361/679.47–679.5, 695–697, 724–727; 415/213.1, 214.1; 416/244 R
See application file for complete search history.

(56) References Cited

U.S. PATENT DOCUMENTS

| | | | | |
|---|---|---|---|---|
| 3,349,414 A * | 10/1967 | Gutner | | 5/296 |
| 4,709,888 A * | 12/1987 | Cubit et al. | | 248/73 |
| 6,115,250 A * | 9/2000 | Schmitt | | 361/695 |
| 6,496,363 B1 * | 12/2002 | Li | | 361/679.4 |
| 7,002,796 B2 * | 2/2006 | Lao et al. | | 361/695 |
| 7,275,646 B2 * | 10/2007 | Mimlitch et al. | | 211/26 |
| 7,304,843 B2 * | 12/2007 | Peng et al. | | 361/679.48 |
| 7,355,115 B2 * | 4/2008 | Liang | | 174/50 |
| 7,385,814 B1 * | 6/2008 | Chen | | 361/695 |
| 7,403,383 B2 * | 7/2008 | McGuff et al. | | 361/688 |
| 7,481,704 B2 * | 1/2009 | Kao et al. | | 454/184 |
| 7,511,955 B2 * | 3/2009 | Yin | | 361/695 |
| 7,522,415 B2 * | 4/2009 | Fan et al. | | 361/695 |
| 7,535,709 B2 * | 5/2009 | Fan et al. | | 361/695 |
| 7,537,480 B2 * | 5/2009 | Li | | 439/485 |
| 7,545,641 B2 * | 6/2009 | Chen | | 361/695 |
| 7,573,712 B2 * | 8/2009 | Wu et al. | | 361/695 |
| 7,586,746 B2 * | 9/2009 | Liu | | 361/695 |
| 7,595,982 B2 * | 9/2009 | Ong et al. | | 361/679.49 |

(Continued)

*Primary Examiner* — Jonathan Liu
*Assistant Examiner* — Guang H Guan
(74) *Attorney, Agent, or Firm* — Altis & Wispro Law Group, Inc.

(57) ABSTRACT

A mounting apparatus includes a chassis, a bracket, and two resilient plates. The chassis includes two opposite sidewalls. A protrusion and a hook protrude from an inner surface of each sidewall. The bracket includes a fixing plate for mounting a number of fans, and two end plates. Each end plate defines a first slot, a second slot, a first notch communicating with a bottom of the first slot, and a second notch communicating with a bottom of the second slot. The resilient plates are mounted to inner surfaces of the end plates. Each resilient plate defines a hooking hole overlapping one of the second slots. The protrusions extend through the first notches and engage in the first slots. The hooks extend through the second notches and engage in the second slots and the hooking holes, to lock the bracket to the chassis.

8 Claims, 3 Drawing Sheets

(56) References Cited

U.S. PATENT DOCUMENTS

| | | | |
|---|---|---|---|
| 7,688,585 B2 * | 3/2010 | Yin | 361/695 |
| 7,688,592 B2 * | 3/2010 | Gruendler et al. | 361/719 |
| 7,697,287 B2 * | 4/2010 | Yin | 361/695 |
| 7,699,692 B2 * | 4/2010 | Yin | 454/184 |
| 7,701,713 B2 * | 4/2010 | Li | 361/695 |
| 7,748,955 B2 * | 7/2010 | Lee | 415/119 |
| 7,826,230 B2 * | 11/2010 | Lee et al. | 361/759 |
| 7,845,903 B2 * | 12/2010 | Li | 415/186 |
| 7,898,797 B2 * | 3/2011 | Fan et al. | 361/679.4 |
| 7,948,755 B1 * | 5/2011 | Guan | 361/695 |
| 8,009,416 B2 * | 8/2011 | Kang | 361/679.38 |
| 8,068,341 B2 * | 11/2011 | Zhang et al. | 361/695 |
| 8,075,070 B2 * | 12/2011 | Fan et al. | 312/223.2 |
| 8,075,248 B2 * | 12/2011 | Yin et al. | 415/60 |
| 8,077,458 B2 * | 12/2011 | Guan | 361/695 |
| 8,077,459 B2 * | 12/2011 | Zhang et al. | 361/695 |
| 8,208,261 B2 * | 6/2012 | Fan et al. | 361/727 |
| 8,243,437 B2 * | 8/2012 | Chou et al. | 361/679.49 |
| 8,246,301 B2 * | 8/2012 | Li | 415/213.1 |
| 8,254,097 B2 * | 8/2012 | Lu et al. | 361/679.02 |
| 8,272,852 B2 * | 9/2012 | Li | 417/423.14 |
| 8,297,088 B1 * | 10/2012 | Zhang et al. | 70/58 |
| 8,297,719 B2 * | 10/2012 | Tu et al. | 312/223.2 |
| 8,319,121 B2 * | 11/2012 | Wu et al. | 174/535 |
| 8,373,989 B2 * | 2/2013 | Gong et al. | 361/695 |
| 8,379,387 B2 * | 2/2013 | Chuang | 361/695 |
| 8,385,064 B1 * | 2/2013 | Smith et al. | 361/695 |
| 8,395,892 B2 * | 3/2013 | Li | 361/679.49 |
| 8,441,781 B2 * | 5/2013 | Chiang | 361/679.01 |
| 8,477,496 B2 * | 7/2013 | Zhang et al. | 361/695 |
| 2004/0201962 A1 * | 10/2004 | Lao et al. | 361/695 |
| 2006/0133022 A1 * | 6/2006 | Chen et al. | 361/683 |
| 2007/0064386 A1 * | 3/2007 | Peng et al. | 361/687 |
| 2008/0151490 A1 * | 6/2008 | Fan et al. | 361/687 |
| 2008/0151495 A1 * | 6/2008 | Yin et al. | 361/695 |
| 2008/0158813 A1 * | 7/2008 | Yin | 361/695 |
| 2009/0021911 A1 * | 1/2009 | Lee et al. | 361/695 |
| 2009/0021912 A1 * | 1/2009 | Yin | 361/695 |
| 2009/0034191 A1 * | 2/2009 | Yin | 361/695 |
| 2009/0059521 A1 * | 3/2009 | Yin | 361/695 |
| 2009/0257192 A1 * | 10/2009 | Li | 361/695 |
| 2010/0025017 A1 * | 2/2010 | Zhang et al. | 165/104.31 |
| 2010/0027231 A1 * | 2/2010 | Chang et al. | 361/807 |
| 2010/0259143 A1 * | 10/2010 | Fan et al. | 312/223.2 |
| 2010/0290187 A1 * | 11/2010 | Guan | 361/695 |
| 2011/0096500 A1 * | 4/2011 | Zhang et al. | 361/695 |
| 2011/0122580 A1 * | 5/2011 | Guan | 361/695 |
| 2012/0113591 A1 * | 5/2012 | Chuang | 361/695 |
| 2012/0140383 A1 * | 6/2012 | Chiang | 361/679.01 |
| 2012/0243178 A1 * | 9/2012 | Zhang et al. | 361/695 |
| 2012/0328449 A1 * | 12/2012 | Xia et al. | 416/244 R |

* cited by examiner

MOUNTING APPARATUS FOR FANS

BACKGROUND

1. Technical Field

The present disclosure relates to an apparatus for mounting a plurality of fans.

2. Description of Related Art

A chassis of an electronic device may include a bracket, to mount a plurality of fans. However, in mounting the bracket to the chassis by screws or rivets, the screws or rivets are small and difficult to handle, making the installation of the bracket in the chassis labor-intensive.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one".

Figure 1:
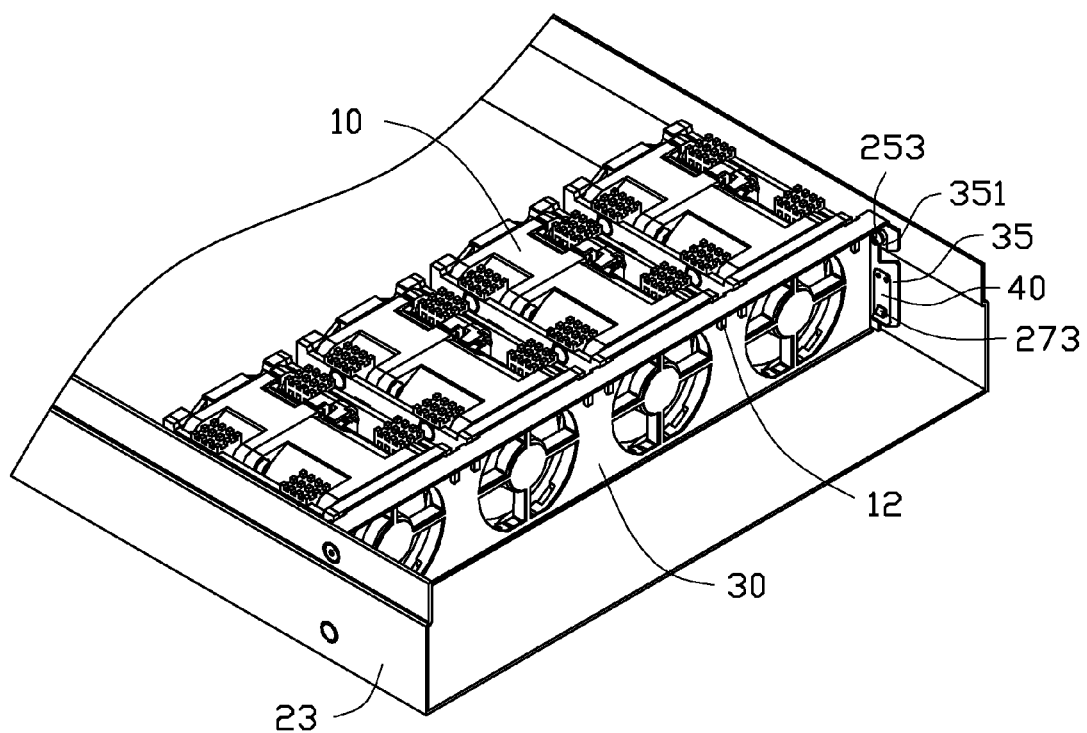
FIG. 1 is an assembled, isometric view of an exemplary embodiment of a mounting apparatus together with a plurality of fans.
Figure 2:
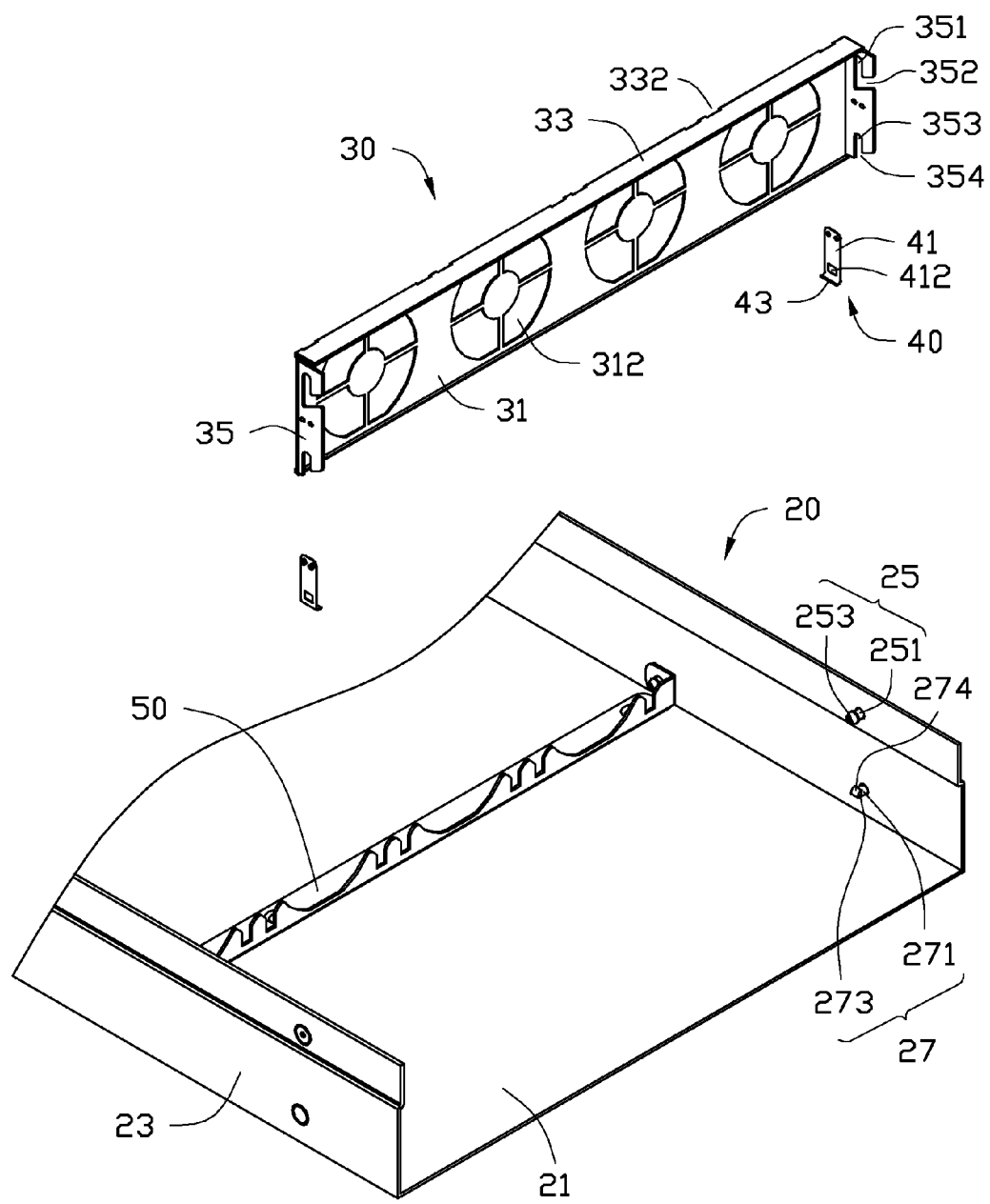
FIG. 2 is an exploded, isometric view of the mounting apparatus of FIG. 1.

FIGS. 1 and 2 show an exemplary embodiment of a mounting apparatus for a plurality of fans 10. The mounting apparatus includes a chassis 20, a bracket 30, and two resilient plates 40.

Each fan 10 includes two substantially L-shaped latches 12 perpendicularly extending from a first end surface of the fan 10 and then perpendicularly extending down.

The chassis 20 includes a bottom wall 21 and two perpendicular sidewalls 23. A protrusion 25 protrudes from an upper portion of the inner surface of each sidewall 23. A hook 27 extends from a lower portion of the inner surface of each sidewall 23 under the protrusion 25. The protrusions 25 align with each other, and the hooks 27 align with each other. Each protrusion 25 includes a connecting portion 251 connected to the inner surface of the sidewall 23 in a substantially perpendicular manner, and a head 253 protruding from a distal end of the connecting portion 251 away from the sidewall 23. A diameter of each head 253 is greater than a diameter of the connecting portion 251. Each hook 27 includes a connecting portion 271 connected to the inner surface of the sidewall 23 in a substantially perpendicular manner, and a hooking portion 273 extending upward from a distal end of the connecting portion 271 away from the sidewall 23. A slanted surface 274 is formed on a side of each hooking portion 271 away from the corresponding sidewall 23.

The bracket 30 includes a substantially rectangular fixing plate 31, a top plate 33 extending from the top of the fixing plate 31 in a substantially perpendicular manner, and two end plates 35 extending from opposite ends of the fixing plate 31 in a substantially perpendicular manner. The extension direction of the top plate 33 is the same as the extension direction of the end plates 35. A plurality of vents 312 is defined in the fixing plate 31, arranged lengthwise. Through holes 332 are defined in the junction between the top plate 33 and the fixing plate 31, each vent 312 having a through hole 332 above and at each side of the vent 312. A first slot 351 is defined in an upper portion of each end plate 35, extending from top to bottom. A first notch 352 is defined in a side of each end plate 35 away from the fixing plate 31, in communication with the bottom end of the first slot 351. A second slot 353 is defined in a lower portion of each end plate 35, extending from top to bottom and with the bottom end of the second slot 353 extending through the bottom of the end plate 35. A second notch 354 is defined in the bottom of the side of each end plate 35 away from the fixing plate 31, in communication with the bottom end of the second slot 353.

Each resilient plate 40 includes a main body 41 and a guide portion 43 slantingly extending down from the bottom end of the main body 41. A hooking hole 412 is defined in the main body 41 adjacent to the guide portion 43.

Figure 3:
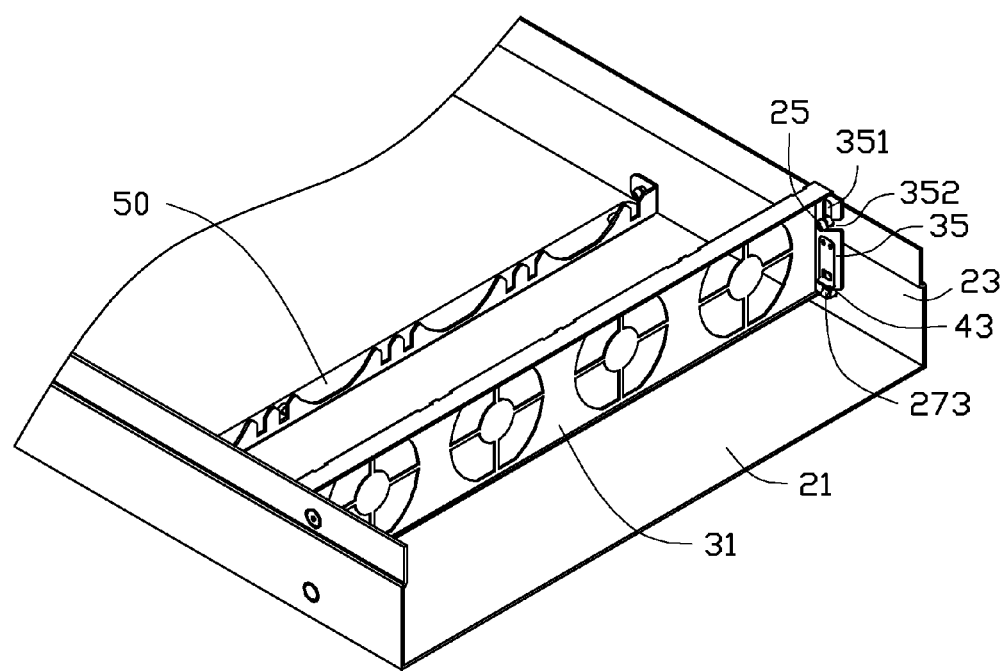
FIG. 3 is a partially assembled, isometric view of the mounting apparatus of FIG. 2.

Referring to FIG. 3, in assembly, the resilient plates 40 are mounted to the inner surfaces of the end plates 35, with the top end of each resilient plate 40 fixed to a portion of the end plate 35, between the first slot 351 and the second slot 353, by screws or rivets. The main bodies 41 rest on the inner surfaces of the end plates 35, and the guide portions 43 extend toward each other. Each hooking hole 412 aligns and overlaps with the top end of one of the second slots 353, and each guide portion 43 is arranged above the transition between the second slot 353 and second notch 354.

The bracket 30 is placed in the chassis 20, with the end plates 35 against the inner surfaces of the sidewalls 23. The protrusions 25 are aligned with the first notches 352, and the hooks 27 are aligned with the second notches 354. The bracket 25 is moved towards the protrusions 25 and the hooks 27, to allow the connecting portions 251 and 271 to respectively extend through the first and second notches 352 and 354, and engage in the first and second slots 351 and 353.

Referring to FIG. 1, the bracket 30 is moved down, so the slanted surfaces 274 abut against the guide portions 43, to deform the bottoms of the resilient plates 40 as they pass over the hooking portions 273. The bracket 30 is pushed further down, until the connecting portions 251 and 271 are collared by the top ends of the first and second slots 351 and 353. The heads 253 engage with the inner surfaces of the end plates 35. The hooking portions 273 align with the hooking holes 412. The bottoms of the resilient plates 40 are able to restore, to engage the hooking portions 273 in the hooking holes 412. Thereby, the bracket 30 is mounted to the chassis 20.

To mount a fan 10, the latches 12 are engaged in two through holes 332 at the sides of a vent 312. Thereby, the first end of the fan 10 is mounted to the bracket 30. A mounting structure 50 is fastened in the chassis 20 opposite to the bracket 30, to securely mount a second end of the fan 10 opposite to the first end.

To detach the bracket 30 from the chassis 20, the bottoms of the resilient plates 40 are deformed to allow the hooking portions 273 to disengage from the hooking holes 412. The bracket 30 is moved up, to allow the protrusions 25 and the hooks 27 to respectively disengage from the first slots 351 and the second slots 353. The bracket 30 is moved away from the protrusions 25 and the hooks 27, to allow the protrusions 25 and the hooks 27 to respectively disengage from the first notches 352 and the second notches 354. Thereby, the bracket 30 can be moved out of the chassis 20.

In other embodiments, the fans 10 can be mounted to the bracket 30 in other manner, such as using screws or plastic clips.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A mounting apparatus for fans, comprising:
   a chassis comprising two opposite sidewalls, wherein a protrusion and a hook under the protrusion protrude from an inner surface of each sidewall;
   a bracket comprising a fixing plate for mounting the fans, and two end plates respectively extending from opposite ends of the fixing plate, wherein each end plate defines a first slot, a second slot under the first slot, a first notch extends through a side of the end plate, away from the fixing plate, and communicates with a bottom end of the first slot, and a second notch extends through the side of the end plate, away from the fixing plate, and communicates with a bottom end of the second slot; and
   two resilient plates respectively mounted to inner surfaces of the end plates, each resilient plate defining a hooking hole aligning and overlapping with a corresponding one of the second slots, wherein when the protrusions respectively extend through the first notches and align with the first slots, the hooks respectively extend through the second notches and align with the second slots; and when the fixing plate is pushed down, the protrusions respectively engage with the first slots, and the hooks respectively move along the second slots, and deform the resilient plates, and then engage in the hooking holes, to lock the bracket to the chassis.

2. The mounting apparatus of claim 1, wherein each protrusion comprises a first connecting portion connected to the inner surface of a corresponding one of the sidewalls in a substantially perpendicular manner, and a head protruding from a distal end of the first connecting portion, the first connecting portions of the protrusions respectively extend through the first notches and engage in the first slots, the heads respectively engage with the inner surfaces of the end plates.

3. The mounting apparatus of claim 2, wherein each hook comprises a second connecting portion connected to the inner surface of the corresponding sidewall in a substantially perpendicular manner, and a hooking portion extending upward from a distal end of the second connecting portion, the second connecting portions of the hooks respectively extend through the second notches and engage in the second slots, the hooking portions respectively engage in the hooking holes of the resilient plates.

4. The mounting apparatus of claim 3, wherein a slanted surface is formed on a side of each hooking portion away from the corresponding sidewall, to deform the resilient plate when the hook extends through the corresponding second notch and engages in the corresponding second slot.

5. The mounting apparatus of claim 4, wherein a guide portion slantingly extends inward from a distal end of each resilient plate, to engage with the slanted surface of the corresponding hook.

6. The mounting apparatus of claim 1, wherein the first and second slots extend from top to bottom in the corresponding end plates, when the hooks engage in the hooking holes, the protrusions and the hooks are respectively collared by top ends of the first and second slots.

7. The mounting apparatus of claim 6, wherein a top of each resilient plate is fixed to a portion of the corresponding end plate between the first and second slots, the hooking holes are respectively defined in lower portions of the resilient plates.

8. The mounting apparatus of claim 1, wherein the fixing plate defines a plurality of vents arranged along a lengthwise direction of the fixing plate, for respectively aligning with the fans.

* * * * *